(12) United States Patent
Dulau et al.

(10) Patent No.: US 6,940,319 B2
(45) Date of Patent: Sep. 6, 2005

(54) DEVICE FOR CONTROLLING HIGH AND LOW LEVELS OF A VOLTAGE-CONTROLLED POWER SWITCH

(75) Inventors: Laurent Dulau, Grenoble (FR); Serge Pontarollo, Saint Martin le Vinoux (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/616,451

(22) Filed: Jul. 9, 2003

(65) Prior Publication Data

US 2004/0239402 A1 Dec. 2, 2004

(30) Foreign Application Priority Data

May 26, 2003 (FR) ............................................. 03 06344

(51) Int. Cl.[7] ................................................. H03K 3/00
(52) U.S. Cl. ...................................... 327/108; 327/483
(58) Field of Search ........................ 327/108–112, 483, 327/491; 361/56, 91

(56) References Cited

U.S. PATENT DOCUMENTS

| | | | | |
|---|---|---|---|---|
| 3,916,263 A | * | 10/1975 | Abbott ......................... | 361/103 |
| 4,168,498 A | * | 9/1979 | Kubota et al. ............... | 345/211 |
| 4,754,158 A | * | 6/1988 | Halberstein ................. | 327/377 |
| 4,860,309 A | * | 8/1989 | Costello ...................... | 375/286 |
| 5,265,003 A | | 11/1993 | Kayser et al. | |
| 5,394,038 A | * | 2/1995 | Sobue et al. ................. | 327/432 |
| 5,483,283 A | * | 1/1996 | Kannegundla ............... | 348/312 |
| 5,533,054 A | * | 7/1996 | DeAndrea et al. .......... | 375/286 |
| 5,583,460 A | | 12/1996 | Dohi et al. | |
| 6,289,055 B1 | * | 9/2001 | Knotz ......................... | 375/286 |

FOREIGN PATENT DOCUMENTS

| | | |
|---|---|---|
| DE | 39 05 645 | 8/1990 |
| DE | 197 25 837 | 12/1998 |
| FR | 2 777 137 | 10/1999 |

* cited by examiner

*Primary Examiner*—Kenneth B. Wells
(74) *Attorney, Agent, or Firm*—Lisa K. Jorgenson; James H. Morris; Wolf, Greenfield & Sacks P.C.

(57) ABSTRACT

A device for controlling a voltage-controlled switch, including two circuits respectively for setting to the high level and for setting to the low level a control terminal of the voltage-controlled switch, one at least of the circuits including a power transistor capable of connecting the control terminal to a high, respectively low voltage, a bipolar control transistor having its emitter, respectively its collector, connected to the control terminal of the power transistor, the base of the control transistor being likely to receive a control current and a first diode connected between a first predetermined voltage smaller than the high voltage, and the base of the control transistor.

23 Claims, 3 Drawing Sheets

DEVICE FOR CONTROLLING HIGH AND LOW LEVELS OF A VOLTAGE-CONTROLLED POWER SWITCH

BACKGROUND OF THE INVENTION

1. Field of the Invention

The present invention relates to the control of voltage-controlled switches, and especially the control of power switches.

2. Discussion of the Related Art

When a control voltage capable of making a voltage-controlled switch operate in a desired conduction state is abruptly applied to said switch, an overcurrent tends to occur in the switch at the turning-on. In particular, in the case of a power switch connected to an inductive load such as an electric motor winding capable of causing voltages on the order of several tens of volts, the overcurrent is likely to damage the switch. To avoid this problem, power switch control devices varying the voltage by stages have been provided. In the case where the power circuit is for example a motor control circuit operating on the mains, and where the power switch is an IGBT or MOS power transistor, the control circuit must provide high voltages and conduct high currents, and no control integrated device of such power switches is currently known.

SUMMARY OF THE INVENTION

An object of the present invention is to provide an integrated and inexpensive device for controlling a voltage-controlled power switch.

To achieve this and other objects, the present invention provides a control device comprising a circuit for setting to the high state and/or a circuit for setting to the low state.

More specifically, the present invention provides a device for controlling a voltage-controlled switch, comprising two circuits respectively for setting to the high level and for setting to the low level a control terminal of the voltage-controlled switch; one at least of said circuits comprising a power transistor capable of connecting the control terminal to a high, respectively low voltage; a bipolar control transistor having its emitter, respectively its collector, connected to the control terminal of the power transistor, the base of the control transistor being likely to receive a control current; a first diode having its cathode, respectively, its anode, connected to a first predetermined voltage smaller than the high voltage, and having its anode, respectively its cathode, connected to the base of the control transistor.

According to an embodiment of the present invention, said at least one of said circuits is the circuit for setting to the high level and it comprises a first output terminal capable of being connected to the control terminal of the voltage-controlled switch; the power and control transistors being first and second NPN-type bipolar transistors forming a Darlington assembly arranged between the first output terminal and the high voltage; the anode of the first diode being connected to the base of the control transistor via a first controllable circuit breaker; and the device being capable of being connected to a control block successively enabling:

a/ applying the control current to the Darlington assembly and turning on the first circuit breaker; and b/ after a first predetermined duration, turning off the first circuit breaker.

According to an embodiment of the present invention, the device further comprises first and second P-channel MOS transistors having their sources connected to the high voltage, a controllable current source being connected to the drain of the first MOS transistor, the gates of the first and second MOS transistors being connected to the drain of the first MOS transistor and the drain of the second MOS transistor being connected to the base of the control transistor and to the drain of a third N-channel MOS transistor, having its source connected to a low supply voltage and the gate of which is capable of being connected to the control block via a second controllable circuit breaker, a second diode having its cathode and its anode respectively connected to the drain of the third MOS transistor and to the first output terminal.

According to an embodiment of the present invention, the first circuit breaker comprises a fourth P-channel MOS transistor having its source connected to the base of the control transistor and having its drain connected to the anode of the first diode, the gate of the fourth MOS transistor being connected via a third resistor to the drain of a fifth P-channel MOS transistor, the source of the fifth MOS transistor being connected to the high voltage, the gate of the fifth MOS transistor being connected to the gate of the first MOS transistor, the gate of the fourth MOS transistor being also connected: to the anode of a first zener diode having its cathode connected to the anode of a second zener diode having its cathode connected to the base of the control transistor; to the anode of a third diode having its cathode connected to the base of the control transistor; and to the cathode of a fourth diode having its anode connected to the drain of the fifth MOS transistor; a fifth diode having its anode connected to the drain of the fifth MOS transistor and its cathode connected to the drain of a sixth N-channel MOS transistor having its source connected to a ground voltage and the gate of which is capable of being connected to the control block.

According to an embodiment of the present invention, the second circuit breaker comprises a buffer circuit having an input terminal, an output terminal, and a control terminal, the output terminal of which can take three states: 1 or 0 according to whether the input terminal is at 1 or 0 when the control terminal is at 1, and a high-impedance state if the control terminal is at 0.

According to an embodiment of the present invention, the device's circuit for setting to the low level comprises a second output terminal capable of being connected to the control terminal of the voltage-controlled switch and comprising: a seventh N-channel MOS transistor arranged between the second output terminal and the low voltage, and the gate of which is capable of being connected to the control block via the second controllable circuit breaker; and a limiting means controllable for, when the second circuit breaker is off, providing the gate of the seventh MOS transistor with an activation voltage as long as the voltage of the second output terminal is greater than a predetermined voltage ranging between the high and ground voltages; the control block enabling, upon activation of the Darlington assembly, provision of a deactivation signal to the gate of the seventh MOS transistor and, a second predetermined duration after the turning-off of the first circuit breaker:

c/ deactivation of the Darlington assembly and turning off the second circuit breaker; and d/ after a third predetermined duration, turning on the second circuit breaker and providing an activation signal to the gate of the seventh MOS transistor.

According to an embodiment of the present invention, the limiting means comprises a third bipolar transistor arranged between the second output terminal and the gate of the seventh MOS transistor, and a sixth diode capable of canceling the base current of the third bipolar transistor when the voltage of the second output terminal is smaller than the second predetermined voltage.

According to an embodiment of the present invention, the collector of the third bipolar transistor is connected via a fourth resistor to the gate of the seventh MOS transistor, a fifth resistor connecting the gate of the seventh MOS transistor to the low voltage, the base of the third bipolar transistor being connected to the cathode of the sixth diode, having its anode connected to the second predetermined voltage, the base of the third bipolar transistor being also connected via a sixth resistor to the drain of an eighth N-type MOS transistor, having its source connected to the ground voltage and the gate of which is capable of being connected to the control block.

The present invention also aims at a control device in which said at least one of said circuits is the circuit for setting to the low level and comprises a first output terminal capable of being connected to the control terminal of the voltage-controlled switch; the power transistor being an N-channel MOS transistor and the control transistor being a PNP-type bipolar transistor having its emitter and its collector respectively connected to the drain and to the gate of the power transistor, the gate of the power transistor being further connected to the low voltage via a resistor and connected via a first controllable circuit breaker to a control terminal of the power transistor; the device being capable of being connected to a control block enabling:

a/ deactivating the circuit for setting to the high level, turning off the first circuit breaker, and applying the control current of the control transistor; and b/ after a first predetermined duration, deactivating the control current of the control transistor, turning on the first circuit breaker, and providing an activation signal to the gate of the power transistor.

According to an embodiment of the present invention, the circuit for setting to the high level comprises: a second output terminal capable of being connected to the control terminal of the voltage-controlled switch; a Darlington assembly arranged between the second output terminal and the high voltage, a control terminal of the Darlington assembly being likely to receive a control current; and a second diode having its cathode connected to a second predetermined voltage smaller than the high voltage and its anode connected to the control terminal of the Darlington assembly via a second controllable circuit breaker; the control block enabling successively:

c/ providing a deactivation signal to the gate of the power transistor, applying the control current of the Darlington assembly, and turning on the second circuit breaker; and d/ after a second predetermined duration, turning off the second circuit breaker.

BRIEF DESCRIPTION OF THE DRAWINGS

The foregoing objects, features, and advantages of the present invention will be discussed in detail in the following non-limiting description of specific embodiments in connection with the accompanying drawings.

DETAILED DESCRIPTION

The same elements have been designated with the same reference numerals in the different drawings. Only those elements necessary to the understanding of the present invention have been shown.

An embodiment of the present invention will be described in the case where the voltage-controlled power switch is an insulated-gate bipolar transistor or IGBT. The present invention aims at a device for controlling a voltage-controlled switch, comprising two circuits (1, 17) respectively for setting to the high level and for setting to the low level a control terminal of the voltage-controlled switch.

Figure 1:
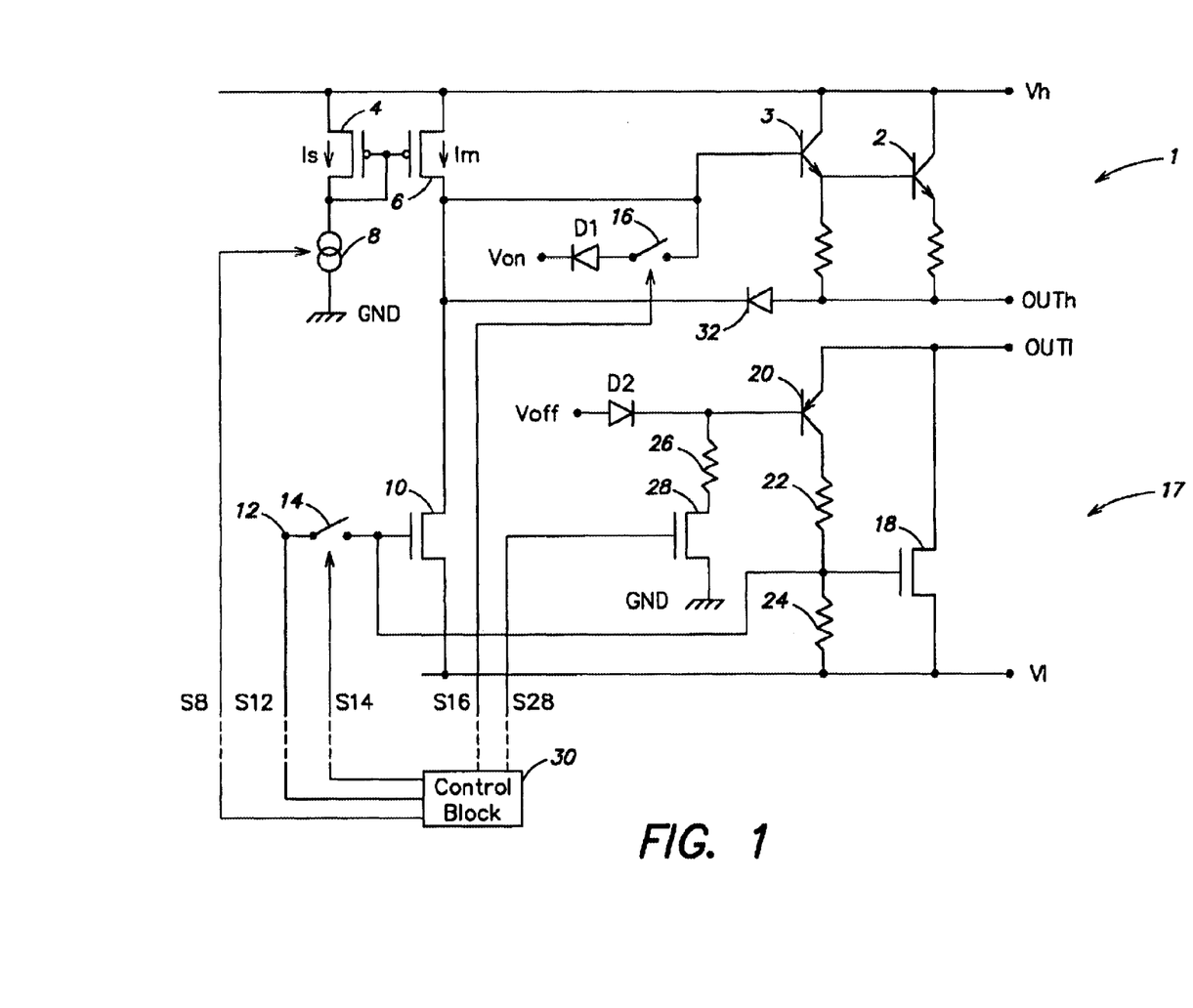
FIG. 1 schematically shows an IGBT control device according to the present invention.

FIG. 1 schematically shows an embodiment of an IGBT control device according to the present invention, of which circuit 1 for setting to the high level comprises a first output terminal OUTh capable of being connected to the gate of an IGBT not shown. Circuit 1 comprises a power transistor 2 connected between a high supply voltage Vh and terminal OUTh and a control circuit for providing an activation signal to transistor 2. Circuit 1 also comprises a circuit activable to cancel the activation signal of transistor 2 when the voltage of terminal OUTh exceeds a voltage Von smaller than voltage Vh.

According to a feature of the present invention, power transistor 2 is an NPN-type bipolar transistor and the control circuit of transistor 2 comprises an NPN-type bipolar transistor 3. Transistors 2 and 3 form a Darlington assembly: their collectors are connected to voltage Vh and their emitters are preferably connected to terminal OUTh, each by a resistor. The base of NPN power transistor 2 is connected to the emitter of NPN power transistor 3. The base of NPN control transistor 3 forms the control terminal of the Darlington assembly.

The control circuit of transistor 2 further comprises two P-channel MOS transistors 4 and 6 assembled as a current mirror, having their sources connected to voltage Vh. The respective drains of transistors 4 and 6 are connected to a current source 8 controllable in all or nothing and to the control terminal of the Darlington assembly. The respective sizes of transistors 4 and 6 are selected for transistor 4 to consume a small current and for the current provided by transistor 6 to enable fast activation of the Darlington assembly. The control terminal of the Darlington assembly is also connected to the drain of an N-channel MOS transistor 10, having its source connected to a low supply voltage Vl. The gate of transistor 10 is connected to a control terminal 12 via a controllable circuit breaker 14. An embodiment of circuit breaker 14 is described hereafter in relation with FIG. 3.

According to a feature of the present invention, the circuit for canceling the activation signal of transistor 2 comprises a diode D1 having its anode connected to the control terminal of the Darlington assembly via a controllable circuit breaker 16. The cathode of diode D1 is connected to a predetermined voltage Von. An embodiment of circuit breaker 16 is described hereafter in relation with FIG. 3.

Current source 8, control terminal 12, and circuits breakers 14 and 16 are capable of being connected to a control block 30. Control block 30 may be integrated with the control device or on a separate chip, as shown by the dotted lines.

Figure 2:
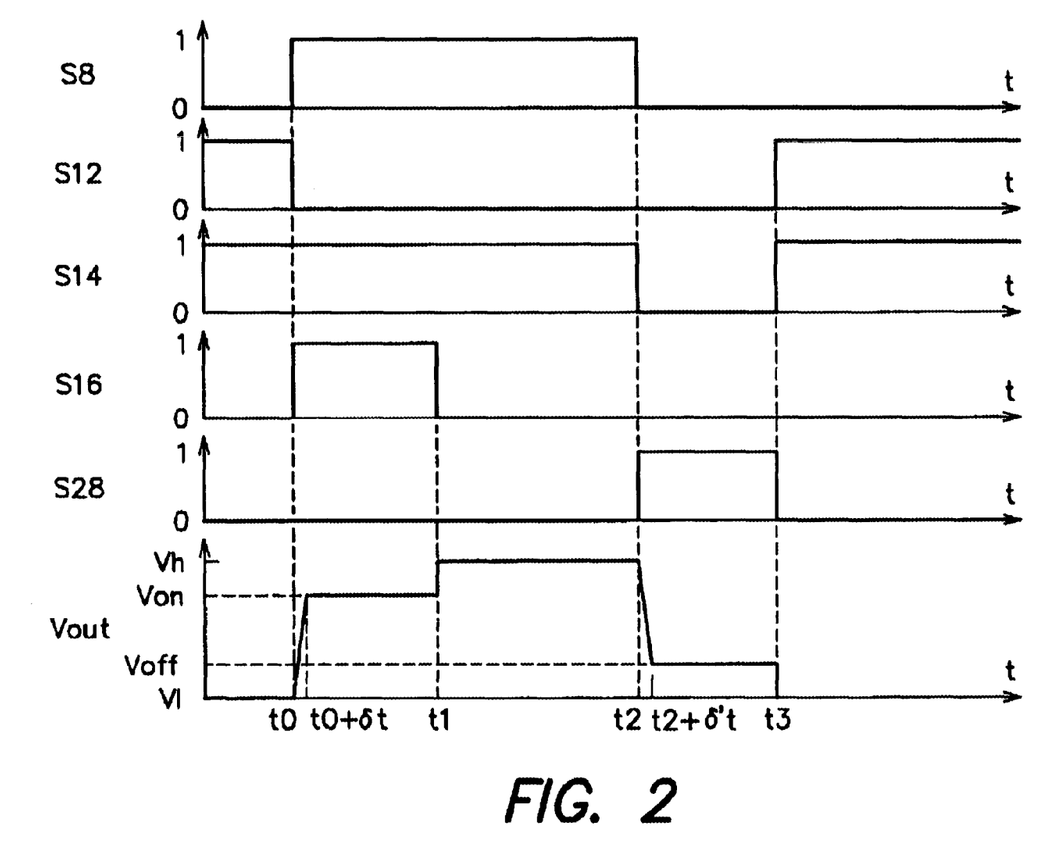
FIG. 2 illustrates the operation of the device of FIG. 1.

FIG. 2 illustrates the operation of circuit 1 for setting to the high level. Signals S8, S12, S14, and S16 respectively show the signals provided to elements 8, 12, 14, and 16. FIG. 2 also shows voltage Vout of terminal OUTh. It is considered that initially, current source 8 is deactivated, that control terminal 12 is at a voltage capable of activating transistor 10, and that circuit breakers 14 and 16 are respectively on and off (which is represented herein with signals S8, S12, S14, and S16 respectively at 0, 1, 1, 0). The activation of transistor 10 maintains voltage Vout substantially at voltage V1.

At a time t0, block 30 activates current source 8, turns on circuit breaker 16, and brings control terminal 12 to a voltage capable of deactivating transistor 10. Current source 8 conducts a current Is, whereby a current Im of fixed value is provided to the control terminal of the Darlington assembly. Current Im activates the Darlington assembly and draws output terminal OUTh towards voltage Vh. The voltage of the control terminal of the Darlington assembly is substantially equal to the voltage of output terminal OUTh (the output voltage plus two diode threshold voltages).

At a time $t0+\delta t$, corresponding to the time when the voltage of the control terminal of the Darlington assembly exceeds a value equal to voltage Von plus the threshold voltage of diode D1, diode D1 turns on. For simplicity, it is considered hereafter that time $t0+\delta t$ corresponds to a time when the voltage of terminal OUTh is substantially equal to voltage Von. Diode D1 is selected so that its turning-on diverts from the control terminal of the Darlington assembly a portion of current Im sufficient to deactivate the Darlington assembly. The capacitor formed by the IGBT gate then remains substantially at voltage Von. In practice, transistors 4 and 6 and the Darlington assembly are selected for voltage Vout to increase fast, and times t0 and $t0+\delta t$ are very close.

At a time t1, a predetermined duration after time t0, block 30 turns off circuit breaker 16. Current Im, which can then no longer run through diode D1, activates back the Darlington assembly which brings terminal OUTh to a voltage substantially equal to voltage Vh. The IGBT is then completely activated.

The control device according to the present invention thus enables providing an increasing voltage Vout between V1 and Vh, with a stage at a predetermined voltage Von for a controllable duration t1–t0.

To activate the IGBT, voltage Vout must be decreased from voltage Vh to voltage V1. It is for this purpose possible to control block 30 to deactivate current source 8 and activate transistor 10, but voltage Vout then decreases without stopping at a stage.

The present invention also provides that the control device can comprise a specific circuit 17 for setting to the low level to decrease voltage Vout with a stop at a stage.

As shown in FIG. 1, an embodiment of circuit 17 for setting to the low level comprises a second output terminal OUT1 capable of being connected to the IGBT gate. In practice, terminals OUTh and OUT1 may be connected together directly to the IGBT gate, or be connected to the IGBT gate via a resistive bridge. Circuit 17 comprises a power transistor 18 connected to voltage V1, and capable of decreasing the voltage of terminal OUT1. According to the present invention, power transistor 18 is controllable either by a circuit enabling decreasing the voltage of terminal OUT1 from voltage Vh to a voltage Voff ranging between Vh and GND, or by control block 30 to decrease the voltage of terminal OUT1 from voltage Voff to voltage V1.

According to a feature of the present invention, power transistor 18 is an N-channel MOS transistor 18 having its drain connected to output terminal OUT1 and its source connected to voltage V1. The gate of transistor 18 is connected to control terminal 12 via circuit breaker 14.

According to a feature of the present invention, the circuit enabling bringing terminal OUT1 to voltage Voff comprises a PNP-type bipolar control transistor 20 having its emitter connected to output terminal OUT1, and having its collector connected via a resistor 22 to the gate of transistor 18. A resistor 24 connects the gate of transistor 18 to voltage V1. The base of transistor 20 is connected to the cathode of a diode D2 having its anode connected to predetermined voltage Voff. The base of transistor 20 is also connected via a resistor 26 to the drain of an N-type MOS transistor 28, having its source connected to a ground voltage GND. A protection diode 32 has its cathode and anode respectively connected to the control terminal of the Darlington assembly and to terminal OUTh. The gate of transistor 28 is capable of being connected to control block 30.

FIG. 2 illustrates the operation of circuit 17 for setting to the low level by means of preceding signals S8, S12, S14, and S16 and of a signal S28 representing the signal provided by block 30 to the gate of transistor 28. Transistor 28 is initially deactivated. It is considered in FIG. 2 that terminals OUTh and OUT1 are connected together and that they are at the same voltage Vout.

At a time t2 when the IGBT is desired to be activated, block 30 deactivates current source 8, turns off circuit breaker 14, and activates transistor 28 by bringing signal S28 from 0 to 1. The deactivation of current source 8 switches off current Im and deactivates the Darlington assembly. A current then flows from terminal OUT1 to ground GND through emitter/base junction transistor 20, then through resistor 26 and through transistor 28. The base current of transistor 20 activates transistor 20, and creates a collector current which raises the gate voltage of transistor 18. Transistor 20 and resistors 22, 24 are chosen so that transistor 18 is then activated and draws output terminal OUT1 towards voltage V1. The base voltage of transistor 20 is equal to the voltage of output terminal OUT1 minus the base-emitter voltage of transistor 20.

At a time $t2+\delta t'$, corresponding to the time when the base voltage of transistor 20 falls below a value equal to voltage Voff minus threshold voltage Vs of diode D2, diode D2 turns on. The on state of diode D2 maintains the base of transistor 20 at voltage Voff–Vs while the voltage of terminal OUT1 keeps on decreasing. When the voltage of terminal OUT1 minus the base-emitter voltage of transistor 20 is smaller than voltage Voff–Vs, the base-emitter junction of transistor 20 blocks and transistor 20 is deactivated. The gate voltage of transistor 18 drops, which deactivates transistor 18. For simplicity, it is considered hereafter that time $t2+\delta t'$ corresponds to a time when the voltage of terminal OUT1, substantially equal to voltage Voff, stops decreasing. The capacitor formed by the IGBT gate then substantially remains at voltage Voff. In practice, transistors 18 and 20 and resistors 22, 24 are selected for voltage Vout to decrease fast, and times t2 and $t2+\delta t'$ are very close.

At a time t3, a predetermined time after time t2, block 30 turns on circuit breaker 14, deactivates transistor 28, and brings control terminal 12 to a voltage capable of activating transistors 10 and 18. The activation of transistors 10 and 18 lowers voltage Vout to voltage V1.

The voltage of the output terminal of the device according to an embodiment of the present invention thus decreases between Vh and V1, with a stage at a predetermined voltage Voff for a controllable duration t2–t3.

The values of Von and Voff are set by the user, for example, by means of zener diodes, so that Von<Vh and Voff>GND, with Von–GND>Vt and Vh–Voff>Vt, where Vt is the threshold voltage of the controlled IGBT, the IGBT source being grounded.

Advantageously, the gates of transistors 10 and 18 are interconnected, whereby transistors 10 and 18 can be activated or deactivated together by means of a single control signal.

Figure 3:
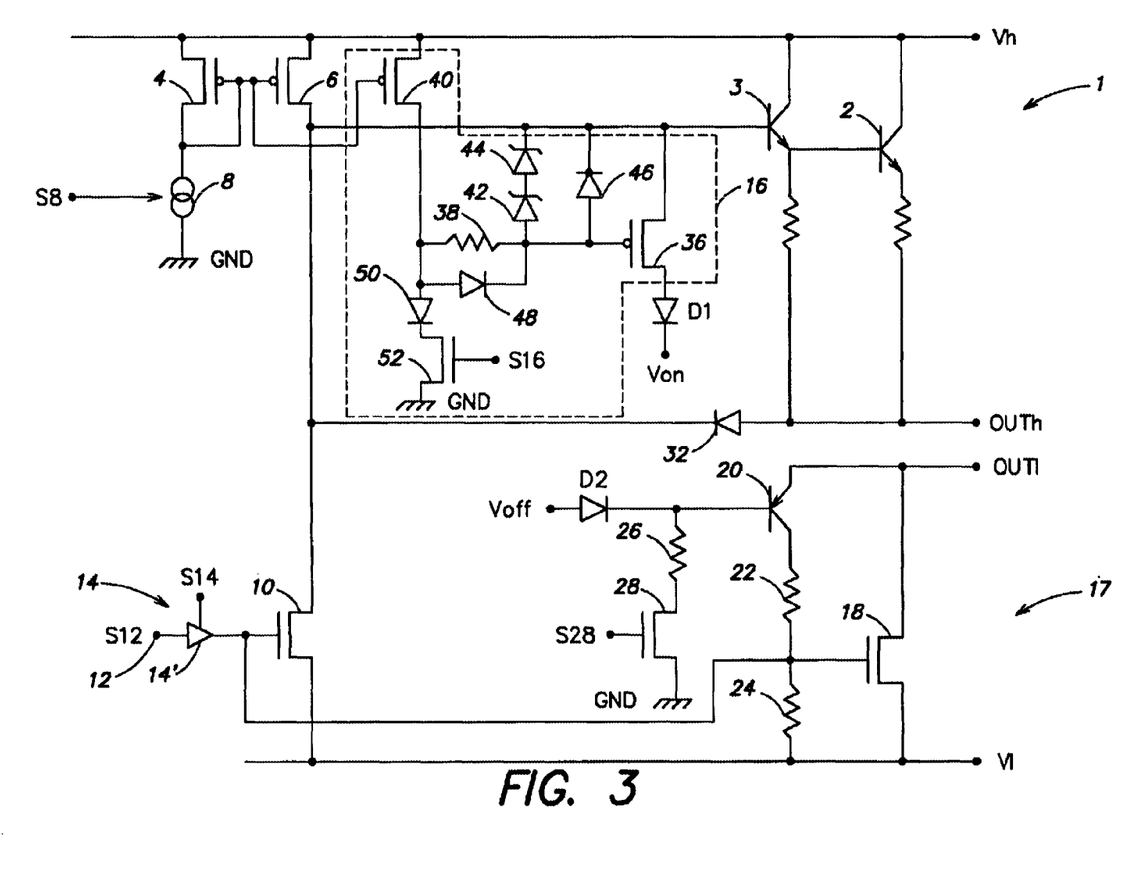
FIG. 3 shows in detailed fashion an embodiment of controllable circuit breakers of FIG. 1.

FIG. 3 shows a device such as shown in FIG. 1 in which an embodiment of circuit breakers 14 and 16 has been shown in detail.

Circuit breaker 14 comprises a buffer circuit 14', the output terminal of which can take three states: 1 or 0 according to whether its input terminal is at 1 or 0 or if a control terminal receiving signal S14 is at 1 (off circuit breaker), and a high-impedance state if the control terminal receiving signal S14 is at 0 (on circuit breaker).

Circuit breaker 16 comprises a P-channel MOS transistor 36 having its source connected to the control terminal of the Darlington assembly and having its drain connected to the anode of diode D1. The gate of transistor 36 is connected via a resistor 38 to the drain of a P-channel MOS transistor 40. The source of transistor 40 is connected to voltage Vh. The gate of transistor 40 and is connected to the gate of transistor 4, so that transistor 40 forms a current mirror with transistor 4. The gate of transistor 36 is also connected to the anode of a zener diode 42 having its cathode connected to the anode of a zener diode 44 having its cathode connected to the control terminal of the Darlington assembly. The gate of transistor 36 is further connected to the anode of a diode 46 having its cathode connected to the control terminal of the Darlington assembly, and to the cathode of a diode 48 having its anode connected to the drain of transistor 40. A diode 50 has its anode connected to the drain of transistor 40 and its cathode connected to the drain of an N-channel MOS transistor 52 having its source connected to ground GND. The gate of transistor 52 is connected to block 30, for example, to receive control signal S16 illustrated in FIG. 2.

When signal S16 is at 1, transistor 52 is activated and draws the drain of transistor 40 substantially to ground. The gate voltage of transistor 36 is drawn to ground (said gate being connected to the drain of transistor 40 via resistor 38 which conducts no current as long as no current is conducted by zener diodes 42, 44). As seen previously, when the voltage of the output terminal increases, the source voltage of transistor 36, equal to the output voltage plus two diode threshold voltages Vbe, also increases. When Vt−Vgs>0, where Vt and Vgs are respectively the threshold voltage and the gate-source voltage of transistor 36, transistor 36 is activated. Switch 16 is then on. The gate voltage of transistor 36 is limited to Vh−2Vz, where Vz is the zener voltage of diodes 42 and 44. Voltage 2Vz is selected to protect the gate of transistor 36 while guaranteeing a low resistance Ron of transistor 36. It should be noted that the device will operate even if the source-gate voltage of transistor 36 does not reach 2Vz.

When signal S16 is at 0, transistor 52 is inactive, the current conducted by transistor 40 is provided to the control terminal of the Darlington assembly via diodes 48 and 46, the gate of transistor 36 is at a higher voltage than its source, and transistor 36 is deactivated. Circuit breaker 16 is then off. The size of transistor 40 is selected to provide a current capable of rapidly charging the gate of transistor 36 when signal S16 switches from 1 to 0, and this rapidly turns off circuit breaker 16, with a reasonable power consumption. Diode 48 enables getting rid of the time constant which would otherwise be introduced by resistor 38.

Diode 50 blocks the way of the current when the voltage of terminal OUTh becomes negative (when voltage V1 is negative). In the absence of this diode, a current would then flow via the intrinsic diode (not shown) located between the source and the drain of transistor 52, and diodes 48 and 46, and would supply the Darlington assembly in undesirable fashion.

Of course, the present invention is likely to have various alterations, modifications, and improvements which will readily occur to those skilled in the art. In particular, the control device according to the present invention has been shown as comprising both a circuit for setting to the high level and a circuit for setting to the low level according to the present invention, respectively enabling introduction of a stage at the rise and at the fall of the control voltage, but those skilled in the art will easily adapt the present invention to a control device only comprising a circuit for setting to the high level or a circuit for setting to the low level according to the present invention, for example, to introduce a stage at the rise only or at the fall only of the control voltage.

The present invention has been described in relation with the control of an IGBT, but it will easily apply to the control of any other voltage-controlled switch, for example, a MOSfet power transistor.

The present invention has been described in relation with a device providing a voltage control signal stopping as it is rising at a voltage stage Von and as it is falling at a voltage stage Voff but those skilled in the art will easily adapt the present invention to a device providing a voltage control signal stopping at a plurality of stages as it is rising and/or as it is falling, for example, by providing voltages Von and/or Voff that can take a plurality of values.

The present invention has been described in relation with a structure comprising specific elements, but those skilled in the art will easily replace the described elements with equivalent elements. As an example, the described MOS transistors may be of DMOS or VDMOS type. Similarly, resistor 26 may be made of polysilicon or in the form of a so-called "diffused P" resistor, the substrate of which will be left floating. The Darlington assembly may comprise, as shown, transistors having their emitters connected to the output terminal via resistors, or comprise transistors having their emitters directly connected to the output terminal. The three-state buffer circuit may also be replaced with a three-state inverter circuit receiving an inverted control signal. Further, the two transistors of the Darlington assembly may be confounded in a single bipolar transistor.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for controlling a voltage-controlled switch, the device comprising a first circuit for setting to a high level a control terminal of the voltage-controlled switch and a second circuit for setting to a low level the control terminal of the voltage-controlled switch; wherein the first circuit comprises:

a first power transistor capable of connecting the control terminal of the voltage-controlled switch to a high voltage;

a first bipolar control transistor having its emitter connected to the control terminal of the first power transistor, the base of the first control transistor being adapted to receive a control current;

a first diode having a cathode connected to a first predetermined voltage smaller than the high voltage, and having its anode connected to the base of the first control transistor;

a first output terminal capable of being connected to the control terminal of the voltage-controlled switch;

the first power and first control transistors being first and second NPN-type bipolar transistors forming a Darlington assembly arranged between the first output terminal and the high voltage;

the anode of the first diode being connected to the base of the first control transistor via a first controllable circuit breaker; and the first circuit also comprising means for enabling a control block to successively;

a/ apply the control current to the Darlington assembly and turn on the first circuit breaker; and b/ after a first predetermined duration, turn off the first circuit breaker.

2. The control device of claim 1, wherein the device further comprises first and second P-channel MOS transistors having sources connected to the high voltage, a controllable current source being connected to the drain of the first MOS transistor, the gates of the first and second MOS transistors being connected to the drain of the first MOS transistor and the drain of the second MOS transistor being connected to the base of the first control transistor and to the drain of a third N-channel MOS transistor, having its source connected to a low supply voltage, and means for connecting the gate of the third MOS transistor to a control block via a second controllable circuit breaker, a second diode having its cathode and its anode respectively connected to the drain of the third MOS transistor and to the first output terminal.

3. The control device of claim 2, wherein the first circuit breaker comprises a fourth P-channel MOS transistor having its source connected to the base of the first control transistor and having its drain connected to the anode of the first diode, the gate of the fourth MOS transistor being connected via a third resistor to the drain of a fifth P-channel MOS transistor, the source of the fifth MOS transistor being connected to the high voltage, the gate of the fifth MOS transistor being connected to the gate of the first MOS transistor, the gate of the fourth MOS transistor being also connected:

to the anode of a first zener diode having its cathode connected to the anode of a second zener diode having its cathode connected to the base of the first control transistor;

to the anode of a third diode having its cathode connected to the base of the first control transistor;

to the cathode of a fourth diode having its anode connected to the drain of the fifth MOS transistor; and to the anode of a fifth diode having its anode connected to the drain of the fifth MOS transistor and its cathode connected to the drain of a sixth N-channel MOS transistor having its source connected to a ground voltage and the gate of which is capable of being connected to a control block.

4. The control device of claim 2, wherein the second circuit breaker comprises a buffer circuit having a buffer input terminal, a buffer output terminal, and a buffer control terminal, and wherein the buffer output terminal can take three states: 1 or 0 according to whether the buffer input terminal is at 1 or 0 when the buffer control terminal is at 1, and a high-impedance state if the buffer control terminal is at 0.

5. The control device of claim 2, wherein the second circuit comprises a second output terminal capable of being connected to the control terminal of the voltage-controlled switch and comprising:

a second power N-channel MOS transistor arranged between the second output terminal and the low voltage;

means for connecting the gate of the second power MOS transistor to a control block via a second controllable circuit breaker;

a limiting means controllable for, when the second circuit breaker is off, providing the gate of the second power MOS transistor with an activation voltage as long as the voltage of the second output terminal is greater than a second predetermined voltage ranging between the high and ground voltages; and means for enabling a control block to, upon activation of the Darlington assembly, provide a deactivation signal to the gate of the second power MOS transistor and, a second predetermined duration after the turning-off of the first circuit breaker;

c/ deactivate the Darlinglon assembly and turn off the second circuit breaker; and d/ alter a third predetermined duration, turn on the second circuit breaker and provide an activation signal to the gate of the second power MOS transistor.

6. The control device of claim 5, wherein the limiting means comprises a second bipolar control transistor arranged between the second output terminal and the gate of the second power MOS transistor, and a second diode capable of canceling the base current of the second control transistor when the voltage of the second output terminal is smaller than the second predetermined voltage.

7. The control device of claim 6, wherein the collector of the second control transistor is connected via a first resistor to the gate of the second power MOS transistor, a second resistor connecting the gate of the second power MOS transistor to the low voltage, the base of the second control transistor being connected to the cathode of the second diode, having its anode connected to the second predetermined voltage, the base of the second control transistor being also connected via a third resistor to the drain of a control N-type MOS transistor, having its source connected to the ground voltage, and comprising means for connecting the gate of the control N-type MOS transistor to the control block.

8. A device for controlling a voltage-controlled switch, the device comprising a first circuit for setting to a high level a control terminal of the voltage-controlled switch and a second circuit for setting to a low level the control terminal of the voltage-controlled switch, wherein the second circuit comprises:

a power transistor capable of connecting the control terminal of the voltage-controlled switch to a low voltage;

a bipolar control transistor having its collector connected to the control terminal of the power transistor, the base of the control transistor being adapted to receive a control current;

a first diode having an anode connected to a first predetermined voltage smaller than the high voltage, and having its cathode connected to the base of the control transistor;

a first output terminal capable of being connected to the control terminal of the voltage-controlled switch;

the power transistor being an N-channel MOS transistor arranged between the first output terminal and the low voltage;

the control transistor being a PNP-type bipolar transistor having its emitter and its collector respectively connected to the drain and to the gate of the power transistor, the gate of the power transistor being further connected to the low voltage via a resistor and connected via a first controllable circuit breaker to a control block; and the second circuit also comprising means for enabling a control block to:

a/ turn off the first circuit breaker, and apply the control current of the control transistor; and b/ after a first predetermined duration, deactivate the control current of the control transistor, turn on the first circuit breaker, and provide an activation signal to the gate of the power transistor.

9. The control device of claim 8, wherein the first circuit comprises:

a second output terminal capable of being connected to the control terminal of the voltage-controlled switch;

a Darlington assembly arranged between the second output terminal and the high voltage, a control terminal of the Darlington assembly being likely to receive a control current;

a second diode having its cathode connected to a second predetermined voltage smaller than the high voltage and its anode connected to the control terminal of the Darlington assembly via a second controllable circuit breaker; and means for enabling the control block to successively:

c/ provide a deactivation signal to the gate of the power transistor, apply the control current of the Darlington assembly, and turn on the second circuit breaker; and d/ after a second predetermined duration, turn off the second circuit breaker.

10. A device for controlling a voltage-controlled switch, the device comprising a circuit for setting a control terminal of the voltage-controlled switch to a specified voltage, the circuit comprising:

a first power transistor adapted to connect the control terminal of the voltage-controlled switch to the specified voltage;

a first control transistor, wherein the control terminal of the first control transistor is adapted to receive a control current, and wherein another terminal of the first control transistor is connected to the control terminal of the first power transistor; and a first diode having a terminal adapted to connect to a first predetermined voltage, and having another terminal connected to the control terminal of the first control transistor via a first controllable circuit breaker.

11. The control device of claim 10, wherein the first power transistor comprises a bipolar transistor.

12. The control device of claim 10, wherein the first power transistor comprises a MOS transistor.

13. The control device of claim 10, wherein the first power transistor comprises an insulated gate bipolar transistor.

14. The control device of claim 10, wherein the first control transistor comprises a bipolar transistor.

15. The control device of claim 10, wherein the first control transistor comprises a MOS transistor.

16. The control device of claim 10, wherein the specified voltage is a high voltage.

17. The control device of claim 16, further comprising:

a first MOS transistor and a second MOS transistor having sources adapted to connect to the high voltage, the gates of the first MOS transistor and the second MOS transistor being connected to the drain of the first MOS transistor, the drain of the second MOS transistor being connected to the control terminal of the first control transistor and to the drain of a third MOS transistor, and the source of the third MOS transistor being adapted to connect to a low supply voltage;

a controllable current source being connected to the drain of the first MOS transistor;

a means for connecting the gate of the third MOS transistor to a control block via a second controllable circuit breaker; and a second diode having its cathode connected to the drain of the third MOS transistor, the second diode having its anode adapted to connect to the control terminal of the voltage-controlled switch.

18. The control device of claim 17, wherein the first circuit breaker comprises a fourth MOS transistor having its source connected to the control terminal of the first control transistor and having its drain connected to the anode of the first diode, the gate of the fourth MOS transistor being connected via a third resistor to the drain of a fifth MOS transistor, the source of the fifth MOS transistor being adapted to connect to the high voltage, the gate of the fifth MOS transistor being connected to the gate of the first MOS transistor, the gate of the fourth MOS transistor being also connected:

to the anode of a first zener diode having its cathode connected to the anode of a second zener diode, the second zener diode having its cathode connected to the control terminal of the first control transistor;

to the anode of a third diode having its cathode connected to the control terminal of the first control transistor;

to the cathode of a fourth diode having its anode connected to the drain of the fifth MOS transistor; and to the anode of a fifth diode having its anode connected to the drain of the fifth MOS transistor and its cathode connected to the drain of a sixth MOS transistor having its source adapted to connect to a ground voltage and the gate of which is capable of being connected to a control block.

19. The control device of claim 17, wherein the second circuit breaker comprises a buffer circuit having a buffer input terminal, a buffer output terminal, and a buffer control terminal, and wherein the buffer output terminal can take three states: 1 or 0 according to whether the buffer input terminal is at 1 or 0 when the buffer control terminal is at 1, and a high-impedance state if the buffer control terminal is at 0.

20. A device for controlling a voltage-controlled switch, the device comprising a circuit, for setting a control terminal of the voltage-controlled switch to a low voltage, wherein the circuit comprises:

a power transistor adapted to connect the control terminal of the voltage-controlled switch to a low voltage;

a control transistor having a control terminal adapted to receive a control current, wherein a first terminal of the control transistor is connected to the control terminal of the power transistor, and also connected, via a controllable circuit breaker, to a control block, and wherein the first terminal of the control transistor is adapted to connect to the low voltage via a resistor; and a first diode having an anode adapted to connect to a first predetermined voltage, and having its cathode connected to the control terminal of the control transistor.

21. The control device of claim 20, wherein a first terminal of the power transistor is adapted to connect to the control terminal of the voltage-controlled switch, and wherein a second terminal of the power transistor is adapted to connect to the low voltage.

22. The control device of claim 21, wherein a second terminal of the control transistor is adapted to connect to the control terminal of the voltage-controlled switch.

23. The control device of claim 20, the circuit also comprising means for enabling the control block to:

a/ turn off the controllable circuit breaker, and apply the control current of the control transistor; and b/ after a first predetermined duration, deactivate the control current of the control transistor, turn on the controllable circuit breaker, and provide an activation signal to the control terminal of the power transistor.

* * * * *